(12) United States Patent
Ho et al.

(10) Patent No.: US 6,773,937 B1
(45) Date of Patent: Aug. 10, 2004

(54) METHOD OF VERIFYING A MASK FOR A MASK ROM

(75) Inventors: Lien-Che Ho, Hsinchu (TW); Ming-Yu Lin, Hsinchu (TW); Chiu-Hua Chung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/661,482

(22) Filed: Sep. 15, 2003

(30) Foreign Application Priority Data

Jun. 18, 2003 (TW) .......................................... 92116588 A

(51) Int. Cl.⁷ .......................................... H01L 21/8246
(52) U.S. Cl. .......................................... 438/14; 438/275
(58) Field of Search ............................. 438/14, 275–278

(56) References Cited

U.S. PATENT DOCUMENTS

2003/0134478 A1 * 7/2003 Lai et al. ..................... 438/275

* cited by examiner

*Primary Examiner*—H. Jey Tsai
(74) *Attorney, Agent, or Firm*—Rabin & Berdo, P.C.

(57) ABSTRACT

In a method to verify a mask for a mask ROM, a serial of random codes that are exclusive to each other are implanted into a plurality of wafers manufactured by a same process with the mask or a plurality of die regions in a single wafer manufactured by a same process with the mask, and then the test results derived from the implanted wafers or die regions are compared to determine if the mask is defective.

6 Claims, 3 Drawing Sheets

METHOD OF VERIFYING A MASK FOR A MASK ROM

FIELD OF THE INVENTION

The present invention relates generally to a mask read-only memory (ROM), and, more particularly, to a method to verify the mask for a mask ROM.

BACKGROUND OF THE INVENTION

Conventionally, the verification for mask ROMs applies ion implantation of binary random code, i.e., "0" and "1", to the memory cells of each memory chip and then reads the implanted code out from the memory cells one by one to be further compared with the original implantation pattern so as to determine the chip is perfect or defective. As shown in FIG. 1, for example, a memory chip 10 includes a plurality of memory cells implanted with a "0" or "1" code, a plurality of buried diffusion layers 12, and a plurality of polysilicon layers 14, in which the region highlighted with a dotted line indicates a defective memory cell 16. Unfortunately, there can be only one, "0" or "1", to be verified in a verification system. For instance, in a system capable of verifying code "0" to be defective, a defective cell implanted with code "1" may be read a "0" out and thus is supposed to be a perfect cell. Particularly, In FIG. 1, the random code implanted into the defective memory cell 16 is "1", and in this case, if the cell implanted with code "1" can be verified to be defective, then the defect of the cell 16 can be verified, and thus the mask for the process to manufacture the memory chip 10 can be further determined to be defective. However, in another case that only the cell with implanted code "0", can be verified to be defective, the cell 16 cannot be verified to have a defect, and therefore the mask used to produce the chip 10 cannot be verified defective as well. Since conventional verification method cannot completely verify each memory cell to determine if there is a defect, the photomask used for the process cannot be subsequently accurately verified defective or not.

Accordingly, it is desired a method to completely verify the photomask for mask ROMs.

SUMMARY OF THE INVENTION

An object of the present invention is to provide a method that can completely verify the photomask for mask ROMs.

In an embodiment according to the present invention, a verification of the mask for a mask ROM includes implanting a binary random code and its reverse tone into two chips that are manufactured by the same process with the mask, and then testing the two chips and comparing their test results. The two chips used for the verification can be selected from different wafers that are manufactured by the same process with the mask, or from two die regions of a single wafer manufactured by a process with the mask under verified.

For verification of a mask for a mask ROM according to another embodiment, several exclusive random codes are implanted into a plurality of chips, respectively, and the coded chips are then tested for comparison of their test results to determine if the mask is perfect or defective. Likewise, the chips to carry out the verification can be selected from different wafers manufactured by the same process with the mask, or from two die regions of a single wafer with the verified mask.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIG. 3 shows exemplary random codes in a four state system to be implanted into chips.

DETAILED DESCRIPTION OF THE INVENTION

Figure 1:
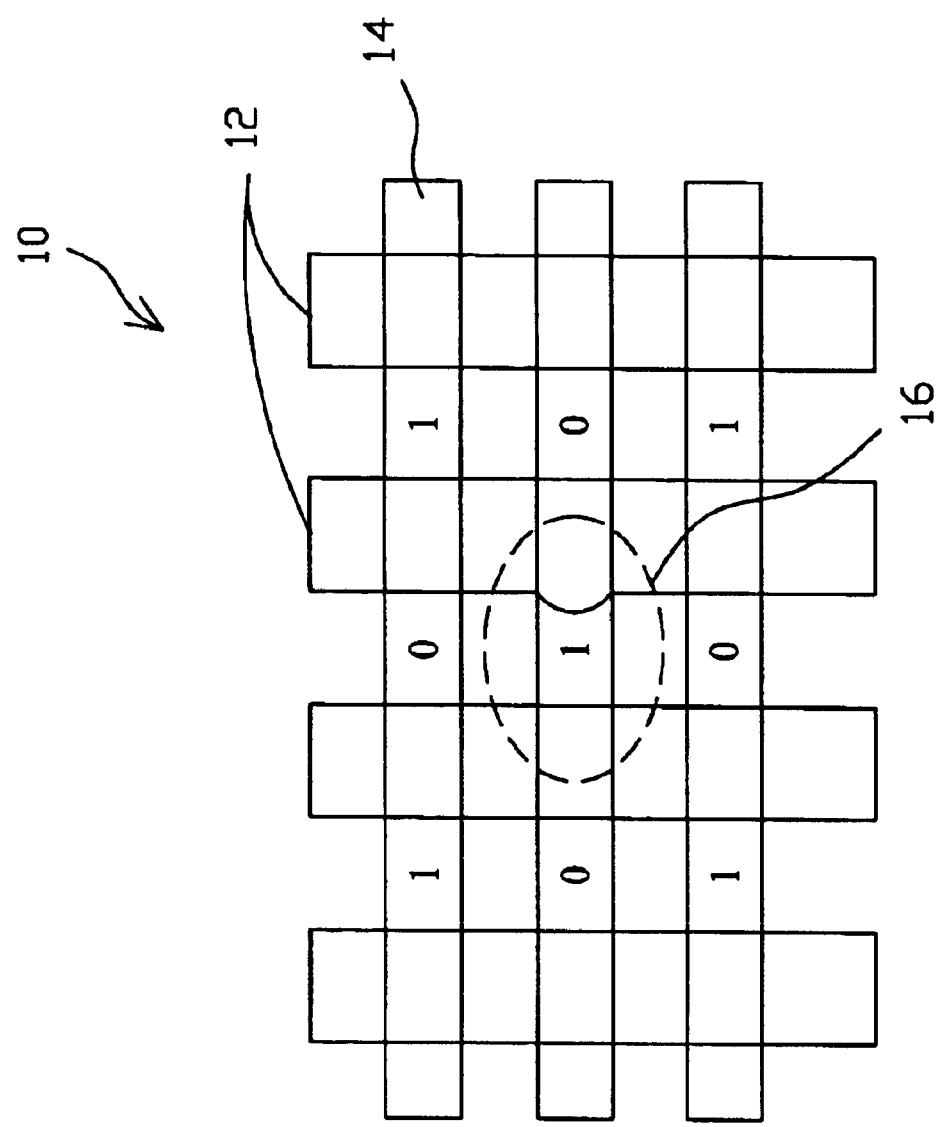
FIG. 1 is the top view of a memory cell array implanted with a random code.
Figure 2B:
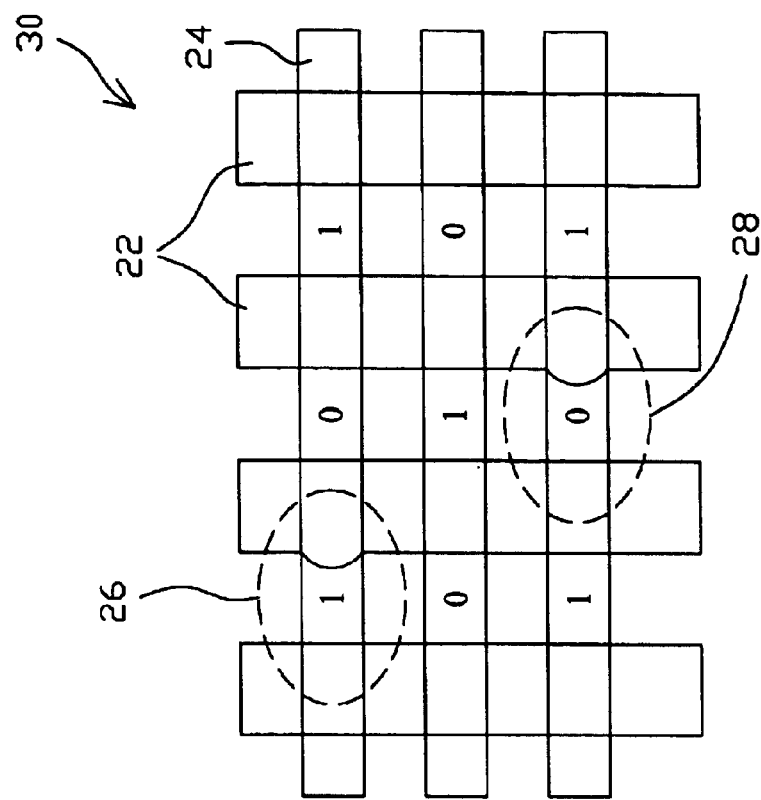
FIG. 2A and FIG. 2B are the top views of two memory cell arrays implanted with a random code and its reverse tone.
Figure 2A:
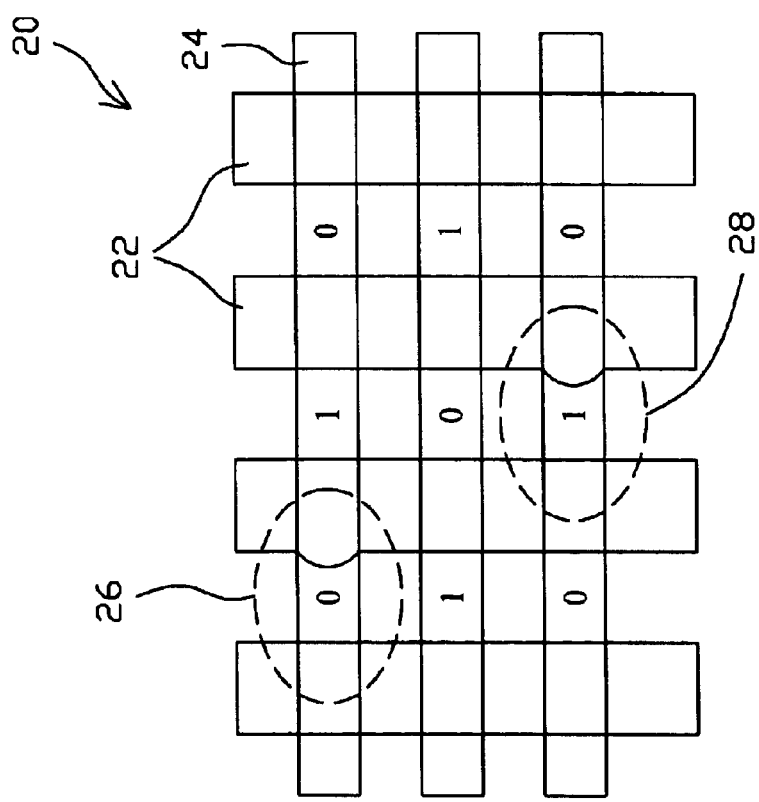

For the verification of a mask for a binary mask ROM, two chips 20 and 30 manufactured by a same photomask process are selected first, as shown in FIG. 2, and the structures of the chips 20 and 30 are substantially the same since they are obtained from the same process. The structure of the chip 20 or 30 includes a plurality of buried diffusion layers 22 and a plurality of polysilicon layers 24, and each memory cell thereof is located at the polysilicon layer 24 between two adjacent buried diffusion layers 22, in which the regions marked by two dotted lines indicate two defective memory cells 26 and 28. Then the chip 20 is implanted with a binary random code, and the chip 30 is implanted with another binary code that is the reverse tone derived from the binary random code implanted into the chip 20. In particular, the reverse tone code for the chip 30 has a reverse tone with respect to the random code for the chip 20, as shown in FIG. 2A and FIG. 2B. Subsequently, the chips 20 and 30 are tested to obtain their respective test results. Under verified, the code of the memory cell 28 on the chip 20 is "1" and thus the defect thereof can be detected. However, the code of the memory cell 26 on the chip 20 is "0", so the defect of the memory cell 26 cannot be detected. As a result, it is concluded from the test that the memory cell 28 is defective and the memory cell 26 is a normal one. On the other hand, when the chip 30 is verified, the reverse tone code of the memory cell 26 is "1", so that its abnormality can be detected, and the reverse tone code of the memory cell 28 cannot be detected since it is a "0". As a result, the test to the chip 30 results in that the memory cell 26 is defective and the memory cell 28 is a normal one. Finally, the test results of the chips 20 and 30 are compared or combined, and thereby two defects can be verified on the photomask that is used to produce the chips 20 and 30 at the patterns for the memory cells 26 and 28. Apparently, in this embodiment, it is not necessary to have the implanted code to be "1" to be detected defective and the implanted code "0" undetectable. Contrarily, it can be set to detect abnormality only when the implanted code is "0" and the implanted code "1" undetectable.

The chips 20 and 30 in the previous embodiment can be selected from two wafers manufactured by a same photomask process or from two die regions on a single wafer manufactured by a process with the same photo mask.

The inventive verification is not limited to be applied for binary random code only. For the random codes in a more state system or multiple state system it is also applicable. FIG. 3 shows an embodiment for a four state code system. Four exclusive random codes are implanted into four chips 40, 42, 44 and 46 in a 4×4 array manner, and for simplicity the chip structures are not shown thereof. First, a random code is implanted into the chip 40, and then the tone of this random code is transferred to a second code to be implanted into the chip 42. Again, the tone of the second code is transferred to a third one to implant into the chip 44. Finally, the tone of the third code is further transferred to a forth code and implanted into the chip 46, as shown in FIG. 3. The chips 40–46 are then tested to generate four test results, and, since these four random codes are exclusive to each other, the photomask used to produce the chips 40, 42, 44 and 46 can be verified to determine if it is perfect or defective.

Likewise, the chips 40–46 in the second embodiment can be selected from four individual wafers manufactured by a same photomask process or from four individual die regions on a single wafer manufactured with the same photo mask.

In summary, to verify a mask for a mask ROM, a random code and its reverse tone, or a plurality of exclusive random codes, are implanted into chips manufactured by the same photomask process at first, and then the coded chips are tested and their test results are combined to determine if the mask is perfect or defective.

While the present invention has been described in conjunction with preferred embodiments thereof, it is evident that many alternatives, modifications and variations will be apparent to those skilled in the art. Accordingly, it is intended to embrace such alternatives, modifications and variations that fall within the spirit and scope thereof as set forth in the appended claims.

What is claimed is:

1. A method of verifying a mask for a mask ROM, comprising the steps of:

selecting a first and second chips manufactured by a process with said mask;

implanting a random code into said first chip and testing said first chip for generating a first test result;

implanting a reverse tone code derived from said random code into said second chip and testing said second chip for generating a second test result; and comparing said first and second test results for determining if said mask is defective.

2. A method according to claim 1, wherein said first and second chips are selected from two wafers, respectively.

3. A method according to claim 1, wherein said first and second chips are selected from two die regions on a wafer.

4. A method of verifying a mask for a mask ROM, comprising the steps of:

selecting a plurality of chips manufactured by a process with said mask;

implanting a plurality of codes exclusive to each other into said plurality of chips, respectively;

testing said plurality of chips for generating a plurality of test results; and comparing said plurality of test results for determining if said mask is defective.

5. A method according to claim 4, wherein said plurality of chips are selected from individual wafers, respectively.

6. A method according to claim 4, wherein said plurality of chips are selected from individual die regions on a wafer.

* * * * *